(12) United States Patent
Akimoto

(10) Patent No.: US 6,480,179 B1
(45) Date of Patent: Nov. 12, 2002

(54) IMAGE DISPLAY INVENTION

(75) Inventor: Hajime Akimoto, Ohme (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/519,995

(22) Filed: Mar. 7, 2000

(30) Foreign Application Priority Data

Mar. 10, 1999 (JP) .......................................... 11-062679

(51) Int. Cl.⁷ ................................................ G09G 3/36
(52) U.S. Cl. ............................ 345/92; 345/87; 345/88; 345/206; 345/211; 345/213; 330/252; 330/261; 330/295; 330/349; 330/110; 257/72; 438/149; 438/150; 438/151; 438/152; 438/153
(58) Field of Search ............................ 345/92, 88, 87, 345/206, 211, 213; 330/252, 261, 295; 438/149, 164, 166; 257/347, 49, 59, 60, 61, 72, 179; 349/110

(56) References Cited

U.S. PATENT DOCUMENTS

| | | | |
|---|---|---|---|
| 5,372,836 A | | 12/1994 | Imahashi et al. ............... 428/8 |
| 6,096,581 A | * | 8/2000 | Zhang et al. ............... 438/149 |
| 6,210,997 B1 | * | 4/2001 | Adachi et al. ............... 438/151 |
| 6,252,215 B1 | * | 6/2001 | Mei et al. ................. 250/208.1 |
| 6,306,694 B1 | * | 10/2001 | Yamazaki et al. .......... 438/151 |
| 6,333,520 B1 | * | 12/2001 | Inoue .......................... 257/72 |

FOREIGN PATENT DOCUMENTS

JP 8-32069 2/1996

* cited by examiner

Primary Examiner—Richard Hjerpe
Assistant Examiner—Ali Zamani
(74) Attorney, Agent, or Firm—Mattingly, Stanger & Malur, P.C.

(57) ABSTRACT

An image display device has an image display section including an insulating substrate having a matrix of pixels formed on an inner surface thereof and a liquid crystal layer sandwiched between the insulating substrate and a substrate opposing the insulating substrate. The image display device includes signal lines, driver circuits for driving the matrix of pixels via the signal lines, voltage amplifiers formed by polycrystalline semiconductor TFTs and each coupled between one of the signal lines and a corresponding one of the driver circuits. The signal lines, the driver circuits and the voltage amplifiers are formed on a surface of the insulating substrate on a side thereof facing the liquid crystal layer. A channel, a source and a drain of the polycrystalline semiconductor TFTs each are formed of a polycrystalline semiconductor film. A gate insulating film and a gate electrode are superposed on the polycrystalline semiconductor film in the order named. The polycrystalline semiconductor TFTs are provided with a second region of the channel having a threshold voltage higher than a threshold voltage of a first region of the channel on a drain side thereof.

20 Claims, 6 Drawing Sheets

IMAGE DISPLAY INVENTION

BACKGROUND OF THE INVENTION

The present invention relates particularly to an image display device including a high-gain high-performance voltage amplifier circuit comprised of polycrystalline field effect transistors.

A prior art TFT (Thin Film Transistor) liquid crystal display device will be explained by reference to FIGS. 10, 11 and 12. FIG. 10 shows a circuit configuration formed on a transparent insulating substrate (not shown) for the TFT liquid crystal display device. A pixel comprises a liquid crystal capacitance 202 and a pixel switch 201 comprised of a polycrystalline semiconductor TFT. A gate of the pixel switch 201 is driven by a gate line scanning register 205 via a gate line 204. A drain of the pixel switch 201 is connected to an output buffer 206 via a signal line 203. An analog signal input line 212 is connected to a signal sampling capacitance 210 via a signal sampling switch 211, and is also inputted to an output buffer 206 via a signal hold switch 208 and a signal hold capacitance 207. The signal sampling switch 211 is controlled by a signal sampling register 213, and the signal hold switch 208 and the output buffer 206 are controlled by a signal hold line 209.

Next, the operation of the above prior art device will be explained. An analog video signal from the analog signal input line 212 is stored in the signal sampling capacitance 210 via the signal sampling switch 211 successively scanned by the signal sampling register 213. After the pixel signals constituting a scanning line have been stored in the respective signal sampling capacitances 210, they are transferred to the respective signal hold capacitances 207 via the respective signal hold switches 208 in synchronism with a clock signal from the signal hold line 209 during a horizontal blanking period and then are inputted to the respective output buffers 206. The output buffers 206 supply outputs having magnitudes according to the input signals to the signal lines 203. At this time the gate line scanning register 205 is driven to select a predetermine one of the gate lines 204 such that a row of the pixel switches 201 corresponding to the scanning line become conducting, and as a result the output signals supplied to the signal lines 203 are written into the liquid crystal capacitances 202.

FIG. 11 is a cross-sectional view of a structure of the pixel switch 201. A channel region is formed by an i region 224, an n⁻ region 225 and an i region 226, and a source 223 and a drain 227 are formed by p⁺ regions on opposite sides of the channel region, respectively. The channel region, the source and the drain are made of polycrystalline semiconductor films. The gate electrode 221 is disposed over the channel region with an insulating film 222 interposed therebetween. Such a prior art pixel switch 201 disposes an n⁻ region 225 in the channel region to form a pin junction in the reverse direction comprised of the drain 227, the n⁻ region 225 and an i layer sandwiched therebetween and thereby reduces a leakage current in its OFF state. Such a prior art technique is disclosed in detail by Japanese Patent Application Laid-open No. Hei 8-32069 (laid-open on Feb. 2, 1996).

Japanese Patent Application Laid-open No. Hei 8-32069 also discloses a technique of forming an output buffer 206 of the peripheral circuit by polycrystalline semiconductor TFTs a cross-sectional view of one of which is shown in FIG. 12. This TFT employs an LDD (Lightly Doped Drain) structure. The reason that this TFT differs in structure from the transistor of the above-explained pixel switch 201 is that high-speed operation is required of this transistor rather than the reduction of the leakage current. An i region 235 forms a channel region, two pairs of a combination of n⁺ and n⁻ regions on opposite sides of the channel region form a source 233 and 234 and a drain 237 and 236, respectively. These i, n⁺ and n⁻ regions are formed of polycrystalline semiconductor films. A gate electrode 231 is disposed over the channel region with an insulating film 232 interposed therebetween.

SUMMARY OF THE INVENTION

But, when the output buffer 206 is formed by the polycrystalline TFTS, as is apparent from a current-voltage characteristic of this TFT shown in FIG. 13, it was found that, when a drain voltage Vds exceeds a pinch-off voltage VA, a phenomenon of rapid increase in drain current occurs in which an actual value 241 of a drain current Ids increases to a considerably larger current than an intrinsic saturation current value 242.

The cause for occurrence of this phenomenon can be thought of as the following. Electron-hole pairs are generated by impact ionization in the boundary region between the i region 235 and n⁻ region 236 because a comparatively high electric field is applied across the boundary between the i region 235 and n⁻ region 236 shown in FIG. 12. The generated holes moves toward the source 234 experiencing pair annihilation with the electrons in the channel, concentration of the holes increases in the channel in the vicinity of the drain 236 during this process and consequently the channel potential of this region is lowered. As a result, an apparent threshold voltage Vth in the vicinity of the drain 236 is decreased when the drain voltage is raised and consequently the drain current increases by a current component corresponding to the hole-generated current.

The above-explained phenomenon of rapid increase in drain current adversely effects the output buffers 206 generally formed by a negative feedback amplifier. The output buffer 206 must be designed to provide a sufficiently large amplifier gain so as to secure its good linearity, but the above phenomenon increases drain conductance extraordinarily and this makes the design of a high-gain amplifier very difficult.

It is an object of the present invention to provide an image display device employing a voltage amplifier circuit such as an output buffer comprised of a TFT with occurrence of the phenomenon of rapid increase in drain current being suppressed.

To accomplish the above object, in accordance with an embodiment of the present invention, there is provided an image display device comprising an image display section including an insulating substrate having a matrix of pixels formed on an inner surface thereof and a liquid crystal layer sandwiched between the insulating substrate and a substrate opposing the insulating substrate comprising: a plurality of signal lines; a plurality of driver circuits for driving the matrix of pixels via the signal lines; a plurality of voltage amplifiers formed by polycrystalline semiconductor TFTs and each coupled between one of the signal lines and a corresponding one of the driver circuits; the signal lines, the driver circuits and the voltage amplifiers being formed on a surface of the insulating substrate on a side thereof facing the liquid crystal layer, wherein a channel, a source and a drain of the polycrystalline semiconductor TFTs each are formed of a polycrystalline semiconductor film, a gate insulating film and a gate electrode are superposed on the polycrystalline semiconductor film in the order named, and the polycrystalline semiconductor TFTs are provided with a second region of the channel having a threshold voltage higher than a threshold voltage of a first region of the channel on a drain side thereof.

BRIEF DESCRIPTION OF THE DRAWINGS

In the accompanying drawings, in which like reference numerals designate similar components throughout the figures, and in which.

DETAILED DESCRIPTION OF THE PREFERRED EMBODIMENTS

Embodiment 1

Figure 1:
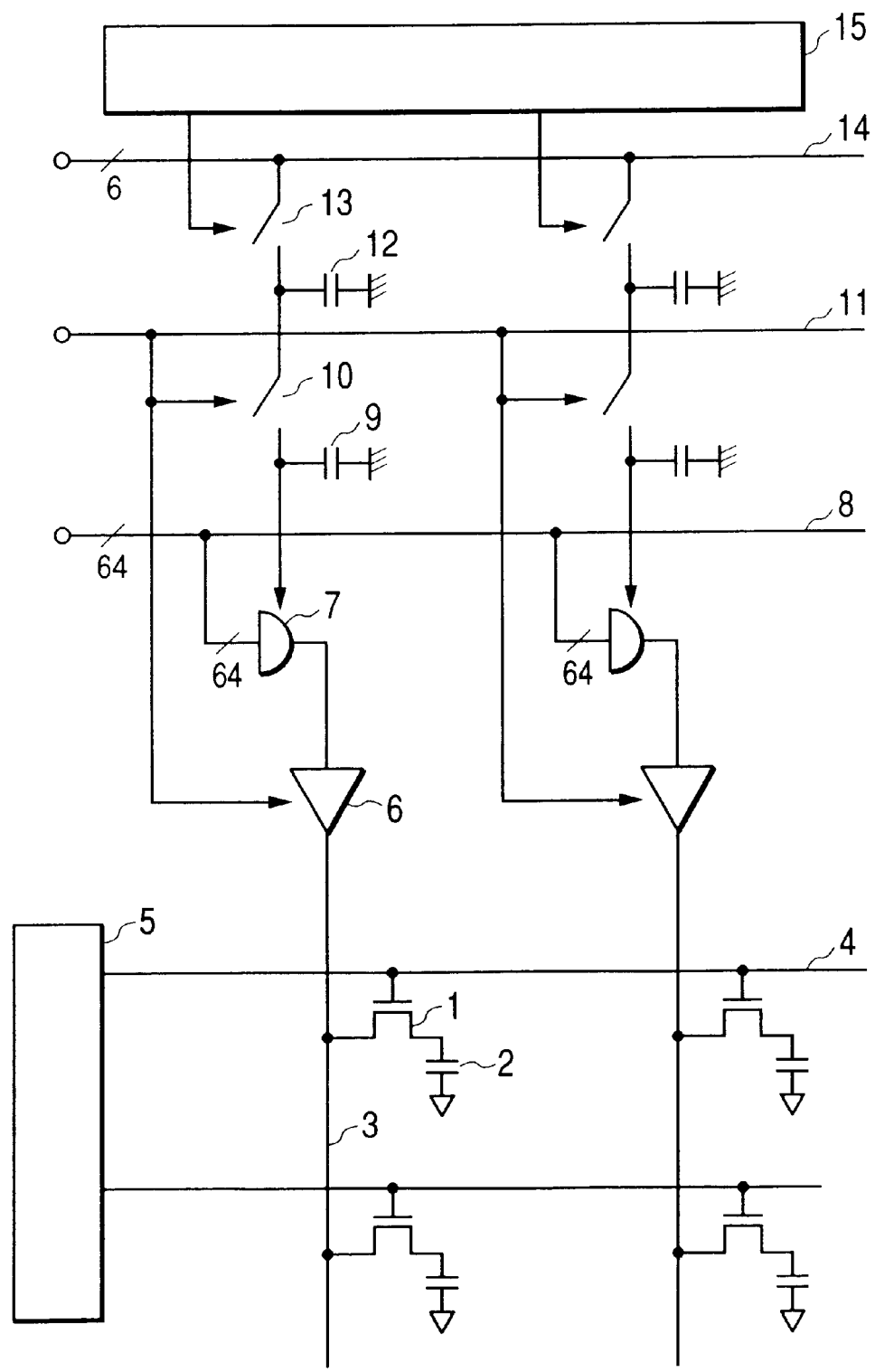
FIG. 1 is a circuit configuration of a TFT liquid crystal image display device in accordance with a first embodiment of the present invention.

A TFT liquid crystal image display device in accordance with a first embodiment of the present invention will be explained by reference to FIGS. 1 to 4. FIG. 1 shows a configuration of a circuit of the TFT liquid crystal image display device formed on an transparent insulating substrate (not shown). A pixel comprises a liquid crystal capacitance 2 and a pixel switch 1 formed by a polycrystalline TFT. A gate of the pixel switch 1 is driven by a gate line scanning register 5 via a gate line 4, and a drain of the pixel switch 1 is connected to an output buffer 6 via a signal line 3.

A digital signal input line 14 is connected to a signal sampling capacitance 12 via a signal sampling switch 13, and is connected to a D/A converter 7 of a 64-gray scale selection type via a signal hold switch 10 and a signal hold capacitance 9. An output of the D/A converter 7 is inputted to the output buffer 6, and the D/A converter 7 is supplied with signals from a 64-gray scale reference signal line 8. The signal sampling switch 13 is controlled by the signal sampling register 15, and the signal hold switch 10 and the output buffer 6 are controlled by a signal hold line 11. The digital signal lines 14 are six in number corresponding to six bits, and therefore the signal sampling switches 13, the signal sampling capacitances 12, the signal hold switches 10 and the signal hold capacitances 9 are also six in number, respectively, for each column of pixels, although not shown. To simplify FIG. 1, a liquid crystal layer, a counter substrate and the like for forming the liquid crystal capacitances 2 are not shown in FIG. 1, either.

Now the operation of the present embodiment will be explained. Digital video signals from the digital signal input lines 14 are stored in the signal sampling capacitances 12 via the signal sampling switches 13 successively scanned by the signal sampling register 15. After the pixel signals constituting a scanning line have been stored in the respective signal sampling capacitances 12, they are transferred to the respective signal hold capacitances 9 via the respective signal hold switches 10 in synchronism with clocks signal from the signal hold line 11 during a horizontal blanking period and then are inputted to the respective D/A converters 7 of the 64-gray scale selection type.

The D/A converters 7 of the 64-gray scale selection type function as a kind of multiplexers such that they select an output signal voltage in accordance with an inputted six-bit data from among 64 gray scale reference signal lines and supply the selected output signal voltage to the output buffers 6, respectively, and the output buffers 6 in turn supply an output in accordance with the signals from the D/A converters 7 to the respective signal lines 3. At this time the gate line scanning register 5 is driven to select a predetermine one of the gate lines 4 such that a row of the pixel switches 1 corresponding to the scanning line become conducting, and as a result the output signals supplied to the signal lines 3 are written into the respective liquid crystal capacitances 2.

Figure 2:
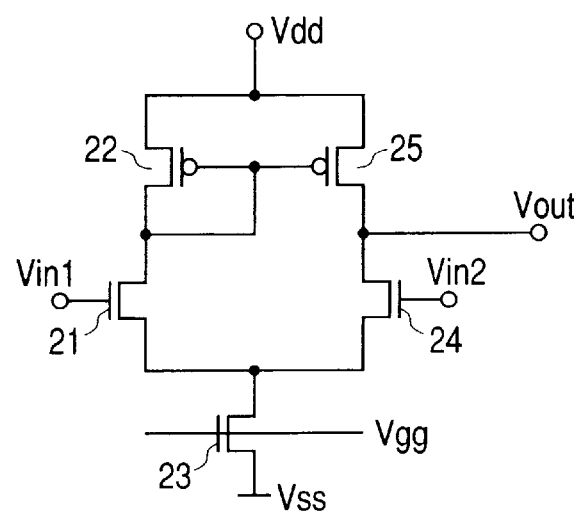
FIG. 2 is a configuration of a differential amplifier forming an output buffer in the TFT liquid crystal image display device in accordance with the first embodiment of the present invention.
Figure 3:
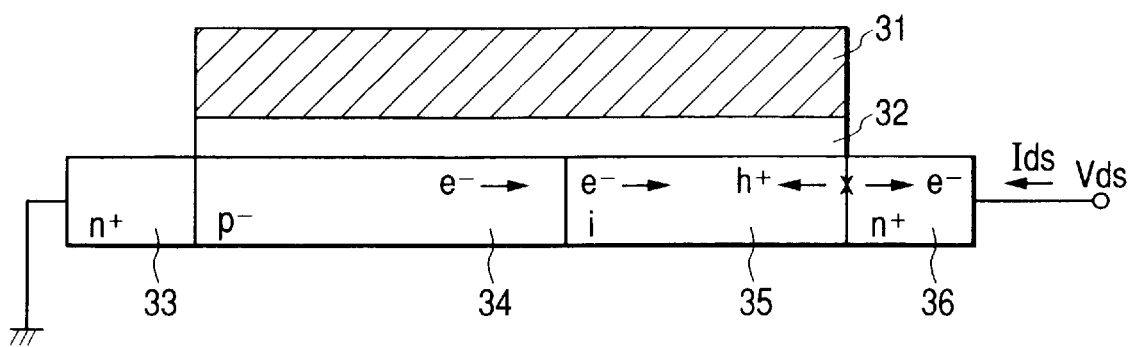
FIG. 3 is a cross-sectional view of a driver TFT in the differential amplifier of the TFT liquid crystal image display device in accordance with the first embodiment of the present invention.

The output buffers 6 are formed by differential amplifiers and are comprised of driver TFTs 24, 22, load TFTs 22, 25 and a current source TFT 23 as shown in FIG. 2. A cross-sectional view of the driver TFTs 21, 24 is shown in FIG. 3. A p$^-$ region 34 and an i region 35 form a channel region and two n$^+$ regions on opposite sides of the channel region form a source 33 and a drain 36, respectively. These are formed of polycrystalline Si semiconductor films, and a gate electrode 31 is disposed over the channel region with an insulating film 32 interposed therebetween.

Figure 4:
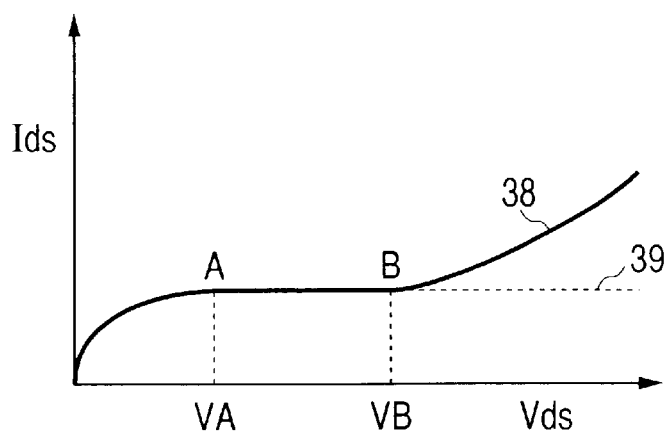
FIG. 4 is a graph showing a current-voltage characteristic of the driver TFT of the differential amplifier of the TFT liquid crystal image display device in accordance with the first embodiment of the present invention.

FIG. 4 shows a current-voltage characteristic of the individual driver TFTs 21, 24 with their source 33 grounded. As is apparent from FIG. 4, an actual value 38 of the drain current Ids remains at an intrinsic value 39 of the saturation current even when the drain voltage Vds exceeds a pinch-off voltage VA, and the drain current Ids does not increase until the drain voltage Vds exceeds a voltage VB.

The reason that the actual value 38 of the drain current Ids remains at the constant intrinsic value 39 of the saturation current even when the drain voltage Vds exceeds the pinch-off voltage VA can be thought of as the following.

Electron-hole pairs are generated by impact ionization in the boundary region between the i region 35 and the drain region 36 because a comparatively high electric field is applied across the boundary between the i region 35 and the drain region 36 of the driver TFTs 21, 24. The generated holes moves toward the source 33 experiencing pair annihilation with the electrons in the channel, concentration of the holes increases in the channel in the vicinity of the drain 36 during this process and consequently the channel potential of this region is lowered.

The explanation up to this point is the same with the prior art device. But, in this embodiment, the p$^-$ region 34 having a threshold voltage Vth higher than that of the i region 35 is disposed in the source 33 side of the channel region and consequently the drain current characteristics are determined by the p$^-$ region 34. That is to say, the effective channel of the TFT of this embodiment is formed by the p$^-$ region 34 and the i region 35 is only a supplementary. Consequently, although an apparent threshold voltage vth of the i region 35 is lowered to any degree due to the increase in concentration of holes, the actual value 38 of the drain current Ids doe not increase and remains at the constant intrinsic saturation current 39. The drain current does not begin to increase until the drain voltage exceeds a voltage at which the holes generated by impact ionization begin to diffuse to the p$^-$ region 34, a voltage indicated as VB in FIG. 4.

By the above-explained mechanism, the phenomenon of rapid increase in the drain current does not appear in the TFT of this embodiment unlike in the prior art TFT. As a result, the drain conductance of the driver TFTs 21, 24 of the differential amplifier can be designed to be very small such that the sufficient gain of the differential amplifier which can be approximated by the ratio of (the mutual conductance)/(the drain conductance) can be secured.

Further, in FIG. 2, it is preferable to employ a construction similar to that of FIG. 3 for the current source TFT 23, and it is also preferable to employ a structure constructed by reversing the arrangement of the p- and n-type regions from that of FIG. 3, for the load TFTs 22, 25. Some advantages are obtained even by employing the structure of this embodiment for some of the above TFTs.

In this embodiment, the driver TFTs 21, 24 are of the n-channel type, it is possible to employ the p-channel type for the driver TFTs as an alternative. Although the TFTs of the planar type are employed in this embodiment, it is also possible to employ modified structures such as a structure of the inverted staggered type without departing from the nature and spirit of the present invention. It is evident from the principle of the present invention that the advantages of the present invention are obtained even if the p$^-$ region 34 is not in contact with the source 33, and another i region, for example, is interposed therebetween.

In the this embodiment, essentially no limitations are imposed to the structure of its liquid crystal display section, and the liquid crystal display section may be of the reflection or transmission type, of the twisted nematic or guest-host type and of other various types including the in-plane switching type.

The present embodiment makes possible the reduction of the drain conductance of the TFT, but if the connections to the source and the drain of the TFT are reversed the advantages of the present invention are lost and the drain conductance becomes larger because the p$^-$ region 34 is in contact with the source 33, and a phenomenon of punch-through of electric charge from the source to the drain occurs at a lower voltage. Therefore, in this embodiment, consideration of polarity of the source and the drain is important and it is undesirable to reverse the polarity of the source and the drain of the TFTs used in the differential amplifier during its operation.

Embodiment 2

Figure 5:
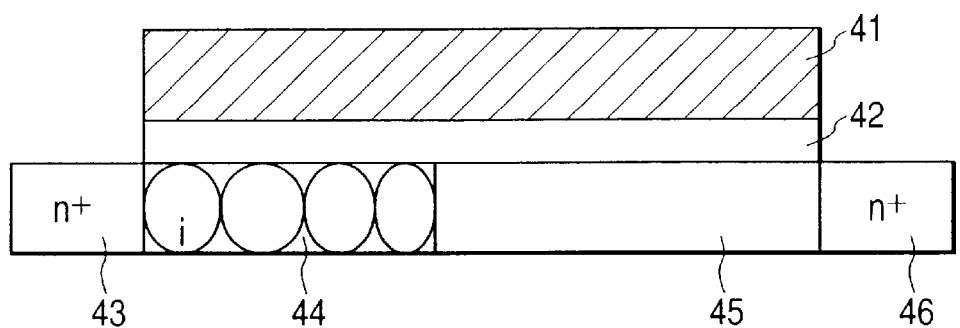
FIG. 5 is a cross-sectional view of a driver TFT in a differential amplifier forming an output buffer of a TFT liquid crystal image display device in accordance with a second embodiment of the present invention.

This embodiment is a structural modification of the TFTs of the differential amplifier employed in the first embodiment of the TFT liquid crystal display device. FIG. 5 is a cross-sectional view of the this embodiment.

The channel region is formed by a small-grained crystalline region 44 and a large-grained crystalline region 45, and a source 43 and a drain 46 are formed by n$^+$ regions on opposite sides of the channel region, respectively. These regions are formed of polycrystalline Si semiconductor films. A gate electrode 41 is disposed over the channel region with a gate insulating film 42 interposed therebetween.

In this embodiment, a threshold voltage vth in the channel on the source 43 side thereof is made larger than that in the channel on the drain 46 side thereof by making the crystalline grain sizes in the channel region on the source 43 side thereof smaller than those in the channel region on the drain 46 side thereof. The channel region on the source 43 side thereof is formed into the small-grained crystalline region 44 having a large number of grain boundaries, so as to take advantage of the fact that the threshold voltage Vth of the TFT increases with carrier capture levels abundant in the grain boundaries.

Therefore, with the TFT structure of the present embodiment also, the increase in drain conductance due to impact ionization is suppressed as in the case of the first embodiment on the similar principle.

The advantages of the present embodiment are that no incorporation of impurities into the channel is required and the impact ionization itself is reduced due to a small number of grain boundary defect levels at the end of the drain.

In this embodiment also, various changes and modifications can be made as described in connection with the first embodiment.

Embodiment 3

Figure 6:
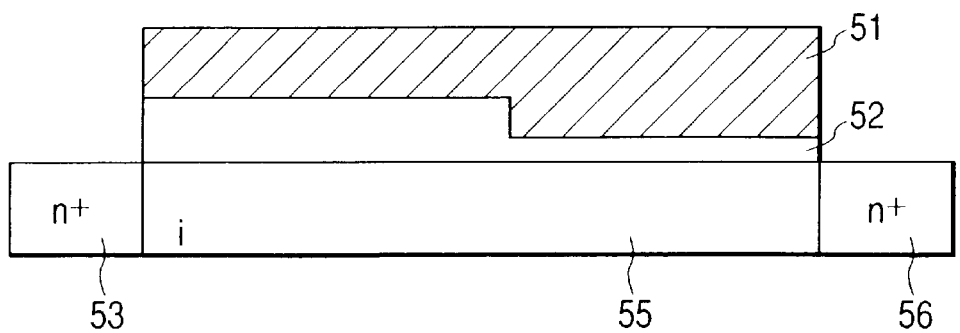
FIG. 6 is a cross-sectional view of a driver TFT in a differential amplifier forming an output buffer of a TFT liquid crystal image display device in accordance with a third embodiment of the present invention.

This embodiment is a modification of the TFTs forming the differential amplifier of the TFT liquid crystal display device of the first embodiment. FIG. 6 is a cross-sectional view of this modification.

The channel region is formed by an i region 55, and a source 53 and a drain 56 are formed by n$^+$ regions on opposite sides of the channel region, respectively. These regions are formed of polycrystalline Si semiconductor films. A gate electrode 51 is disposed over the channel region with a gate insulating film 52 interposed therebetween. A thickness of the gate insulating film 52 on the source 53 side thereof is larger than that of the gate insulating film 52 on the drain 56 side thereof.

In this embodiment, a threshold voltage Vth of the channel on the source 53 side thereof is made larger than that of the channel on the drain 56 side by making the thickness of the gate insulating film 52 on the source 53 side thereof larger than that of the gate insulating film 52 on the drain 56 side thereof.

Therefore, with the TFT structure of the present embodiment also, the increase in drain conductance due to impact ionization is suppressed as in the case of the first embodiment on the similar principle.

The advantages of the present embodiment are that no incorporation of impurities into the channel or no additional processing of the channel film is required.

In this embodiment also, various changes and modifications can be made as described in connection with the first embodiment.

Embodiment 4

Figure 7:
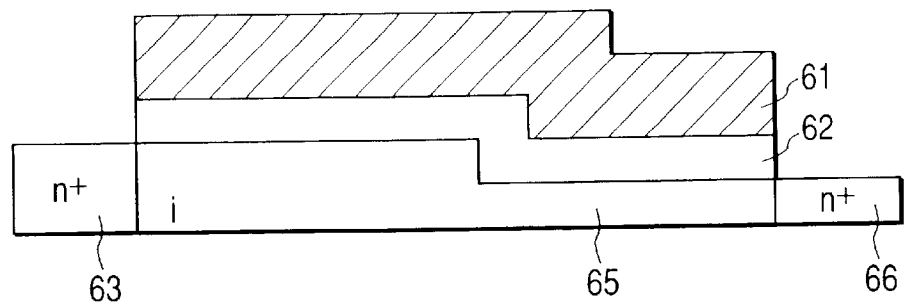
FIG. 7 is a cross-sectional view of a driver TFT in a differential amplifier forming an output buffer of a TFT liquid crystal image display device in accordance with a fourth embodiment of the present invention.

This embodiment is a modification of the TFTs forming the differential amplifier of the TFT liquid crystal display device of the first embodiment. FIG. 7 is a cross-sectional view of this modification.

The channel region is formed by an i region 65, and a source 63 and a drain 66 are formed by $n^+$ regions on opposite sides of the channel region, respectively. These regions are formed of polycrystalline Si semiconductor films. A gate electrode 61 is disposed over the channel region with a gate insulating film 62 interposed therebetween. A thickness of the i region 65 on the source 63 side thereof is larger than that of the i region 65 on the drain 66 side thereof.

In this embodiment, a threshold voltage Vth of the channel on the source 63 side thereof is made larger than that of the channel on the drain 66 side by making the thickness of the i region 65 on the source 63 side thereof larger than that of the i region 65 on the drain 66 side thereof. The channel region on the source 63 side thereof is made thicker than the channel region on the drain 66 side thereof, so as to take advantage of the fact that the threshold voltage Vth of the TFT increases as the concentration of carrier capture levels per unit area increases with increasing thickness of the channel.

Therefore, with the TFT structure of the present embodiment also, the increase in drain conductance due to impact ionization is suppressed as in the case of the first embodiment on the similar principle.

The advantages of the present embodiment are that no incorporation of impurities into the channel is required and the amount of impact ionization is reduced according as the thickness of the end of the channel region on the drain side thereof is reduced.

In this embodiment also, various changes and modifications can be made as described in connection with the first embodiment.

Embodiment 5

Figure 8:
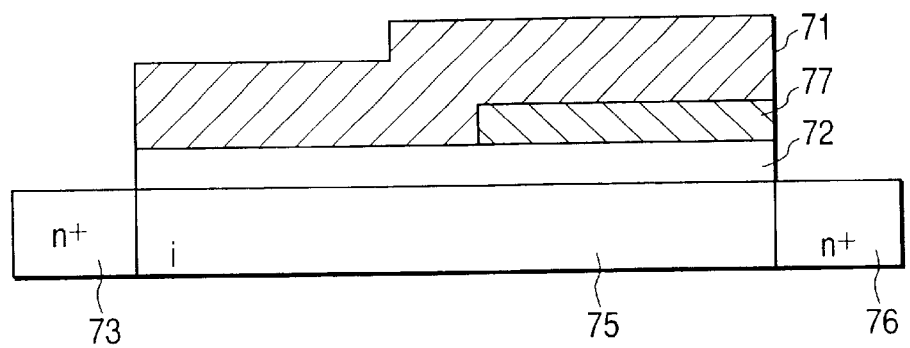
FIG. 8 is a cross-sectional view of a driver TFT in a differential amplifier forming an output buffer of a TFT liquid crystal image display device in accordance with a fifth embodiment of the present invention.

This embodiment is a modification of the TFTs forming the differential amplifier of the TFT liquid crystal display device of the first embodiment. FIG. 8 is a cross-sectional view of this modification.

The channel region is formed by an i region 75, and a source 73 and a drain 76 are formed by $n^+$ regions on opposite sides of the channel region, respectively. These regions are formed of polycrystalline Si semiconductor films. Gate electrodes 71 and 77 are disposed over the channel region with a gate insulating film 72 interposed therebetween. A work function of a material of the gate electrode 71 disposed on the channel region on the source 73 side thereof is larger than that of a material of the gate electrode 77 disposed on the channel region on the drain 76 side thereof.

In this embodiment, the threshold voltage Vth of the channel on its source 73 side is made larger than that of the channel on its drain 76 side by making the work function of a material of the gate electrode 71 on the channel region on its source 73 side larger than that of a material of the gate electrode 77 on the channel region on its drain 76 side.

Therefore, with the TFT structure of the present embodiment also, the increase in drain conductance due to impact ionization is suppressed as in the case of the first embodiment on the similar principle.

The advantage of the present embodiment is that no incorporation of impurities into the channel is required. Even if one of the gate electrodes 71 and 72 is formed of a relatively high-resistance material, there arise no problems overall because they are electrically connected together.

In this embodiment also, various changes and modifications can be made as described in connection with the first embodiment.

Embodiment 6

Figure 9:
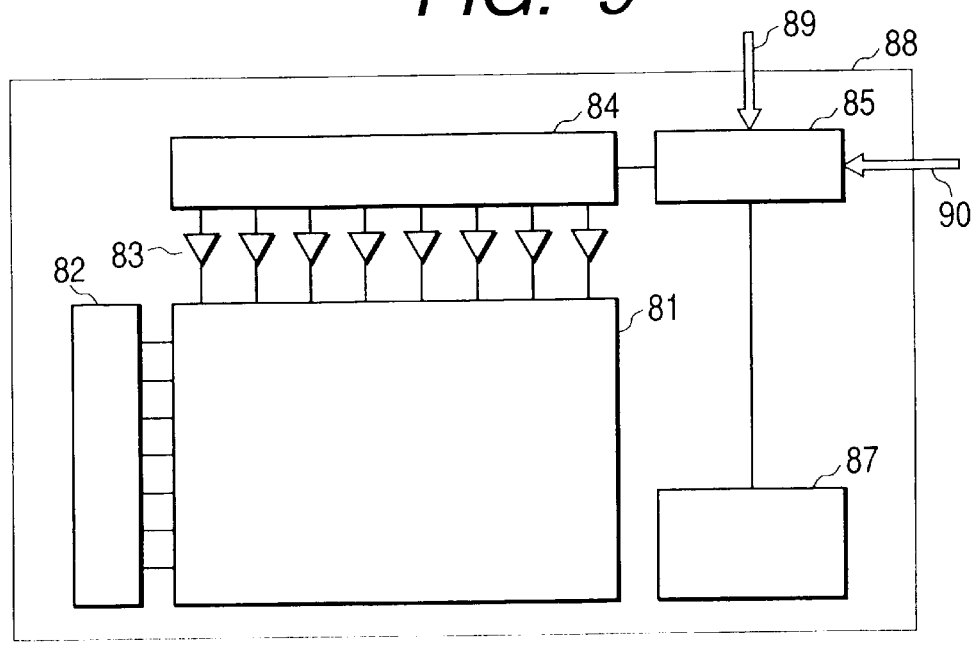
FIG. 9 is a circuit configuration of a TFT liquid crystal image display device in accordance with a sixth embodiment of the present invention.
Figure 10:
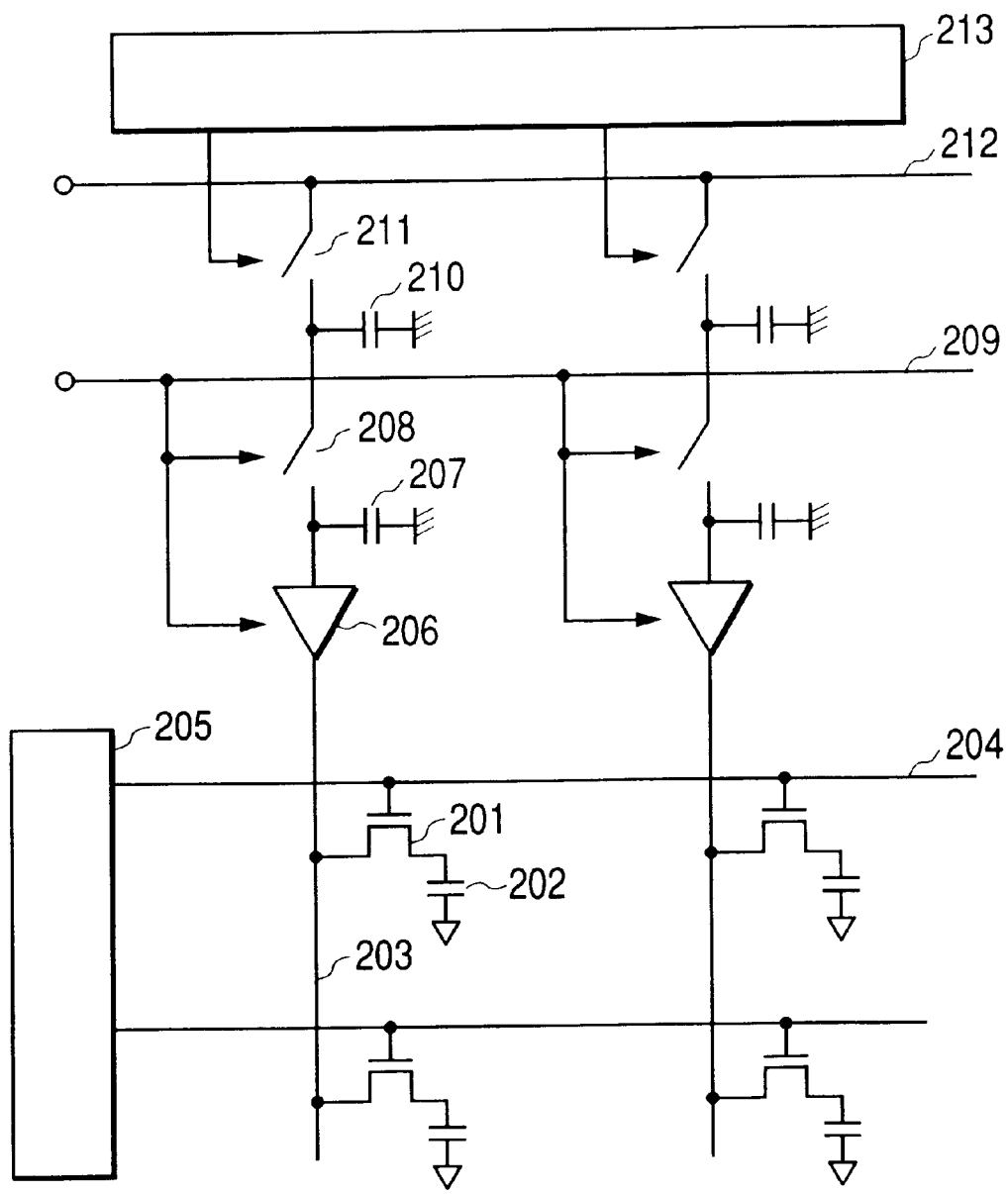
FIG. 10 is a circuit configuration of a prior art TFT liquid crystal image display device.
Figure 11:
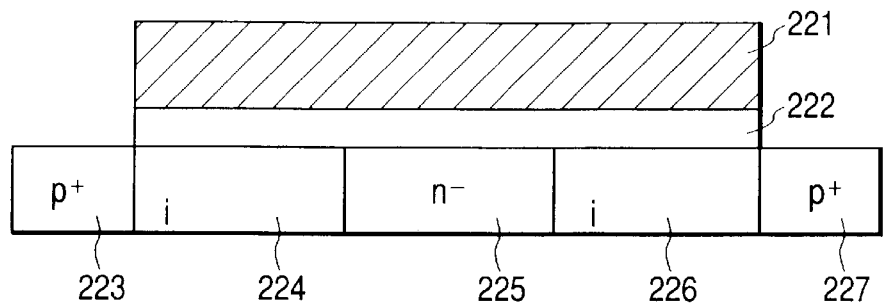
FIG. 11 is a cross-sectional view of a TFT forming a pixel switch in the prior art TFT liquid crystal image display device.
Figure 12:
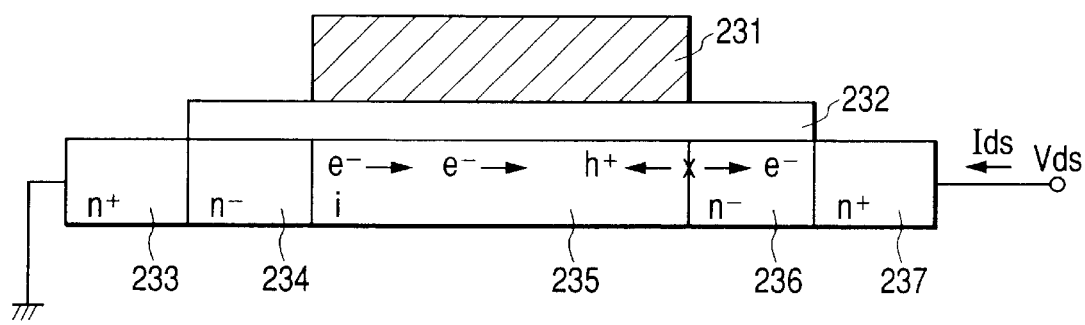
FIG. 12 is a cross-sectional view of a polycrystalline TFT forming a prior art output buffer.
Figure 13:
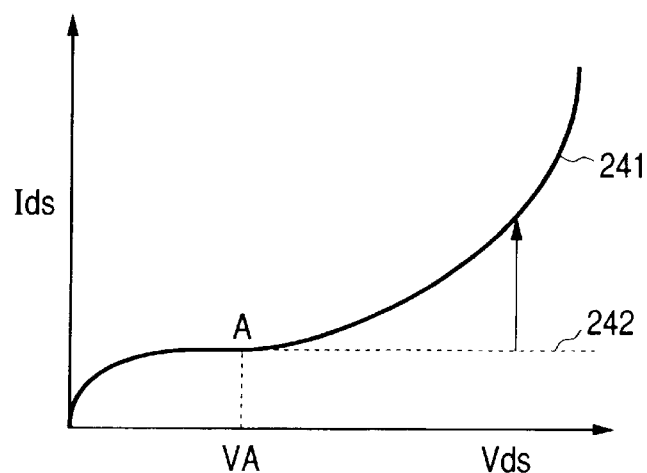
FIG. 13 is a graph showing a current-voltage characteristic of a TFT forming an output buffer of the prior art TFT liquid crystal image display device.

A TFT liquid crystal image display device in accordance with another embodiment of the present invention will be explained by reference to a circuit configuration shown in FIG. 9. There are formed on a transparent insulating substrate 88, a gate line scanning register 82 for scanning a pixel display area 81, a signal input circuit 84 and output buffers 83 connected thereto for inputting video signals to the pixel display area 81, an interface circuit group 85 for converting externally supplied video data 89 and a user's request 90 into video signals and outputting the video signals, a memory circuit 87 for storing a portion of the video signals and the like, all of which are formed of TFT circuits.

The video data are inputted to interface circuit group 85 in the form complying IMT-2000, IrDA, IEEE 1394 or the like by wire or wireless. The user's request includes a user's order and information to be written. If a request from a user is received, externally supplied video data, video data stored in the form of video signals in the memory circuit 87 or information to be written and supplied by the user is displayed on the pixel display area 81. The configuration and operation of the pixel display area 81, the gate line scanning register 82, the signal input circuit 84 and the output buffers 83 are the same as those in the first embodiment.

With this configuration of this embodiment provided with the high-performance output buffer, high-quality video information can be displayed on the pixel display area 81 in accordance with the user's request at all times.

The present invention makes possible the realization of a high-quality image display device provided with output buffers having good linearity.

What is claimed is:

1. An image display device comprising an image display section including an insulating substrate having a matrix of pixels formed on an inner surface thereof and a liquid crystal layer sandwiched between said insulating substrate and a substrate opposing said insulating substrate comprising:
   a plurality of signal lines;
   a plurality of driver circuits for driving said matrix of pixels via said plurality of signal lines;
   a plurality of voltage amplifiers formed by polycrystalline semiconductor TFTs and each coupled between one of said plurality of signal lines and a corresponding one of said plurality of driver circuits;
   said plurality of signal lines, said plurality of driver circuits and said plurality of voltage amplifiers being formed on a surface of said insulating substrate on a side thereof facing said liquid crystal layer, wherein a channel, a source and a drain of said polycrystalline semiconductor TFTs each are formed of a polycrystalline semiconductor film, a gate insulating film and a gate electrode are superposed on said polycrystalline semiconductor film in the order named, and said polycrystalline semiconductor TFTs are provided with a second region of said channel having a threshold voltage higher than a threshold voltage of a first region of said channel on a drain side thereof.

2. The image display device according to claim 1, wherein said image display device further comprises an interface circuit group for converting externally supplied video data and a user's request into video signals and outputting the video signals, a memory circuit for storing a portion of the video signals, said interface circuit group and said memory circuit being formed on said insulating substrate and said plurality of driver circuits transfer the video signals to said matrix of pixels.

3. The image display device according to claim 1, wherein said polycrystalline semiconductor film is a polycrystalline Si semiconductor film.

4. The image display device according to claim 1, wherein said second region of said channel is in contact with said source.

5. The image display device according to claim 1, wherein a third region of said channel having a threshold voltage lower than said threshold voltage of said second region of said channel is provided nearer to said source than to said second region of said channel.

6. The image display device according to claim 5, wherein said polycrystalline semiconductor film in said second region contains an impurity of conductivity type opposite to that of said source and said drain.

7. The image display device according to claim 6, wherein said polycrystalline semiconductor film in at least one of said first and third regions contains no intentionally incorporated impurity.

8. The image display device according to claim 5, wherein crystalline grain sizes of said polycrystalline semiconductor film in said second region of said channel are smaller than those of said polycrystalline semiconductor film in at least one of said first and third regions of said channel.

9. The image display device according to claim 5, wherein a thickness of said gate insulating film over said second region of said channel is larger than that of said gate insulating film over at least one of said first and third regions of said channel.

10. The image display device according to claim 5, wherein a thickness of said polycrystalline semiconductor film in said second region of said channel is larger than that of said polycrystalline semiconductor film in at least one of said first and third regions of said channel.

11. The image display device according to claim 5, wherein a work function of material of said gate electrode over said second region of said channel is higher than that of material of said gate electrode over at least one of said first and third regions of said channel.

12. An image display device comprising an image display section including an insulating substrate having a matrix of pixels formed on an inner surface thereof and a liquid crystal layer sandwiched between said insulating substrate and a substrate opposing said insulating substrate comprising:

a plurality of signal lines;

a plurality of driver circuits for driving said matrix of pixels via said plurality of signal lines;

a plurality of voltage amplifiers formed by polycrystalline semiconductor TFTs and each coupled between one of said plurality of signal lines and a corresponding one of said plurality of driver circuits;

said plurality of signal lines, said plurality of driver circuits and said plurality of voltage amplifiers being formed on a surface of said insulating substrate on a side thereof facing said liquid crystal layer, wherein said polycrystalline semiconductor TFTs are configured such that drain conductance of said polycrystalline semiconductor TFTs increases if electrical connections to said source and said drain are reversed from those in normal operation of said polycrystalline semiconductor TFTs.

13. An image display device comprising an image display section including an insulating substrate having a matrix of pixels formed on an inner surface thereof and a liquid crystal layer sandwiched between said insulating substrate and a substrate opposing said insulating substrate comprising:

a plurality of signal lines;

a plurality of driver circuits for driving said matrix of pixels via said plurality of signal lines;

a plurality of voltage amplifiers formed by polycrystalline semiconductor TFTs and each coupled between one of said plurality of signal lines and a corresponding one of said plurality of driver circuits;

said plurality of signal lines, said plurality of driver circuits and said plurality of voltage amplifiers being formed on a surface of said insulating substrate on a side thereof facing said liquid crystal layer, wherein said polycrystalline semiconductor TFTs are configured such that a drain voltage at which punch-through of electric charge from said source to said drain occurs decreases if electrical connections to said source and said drain are reversed from those in normal operation of said polycrystalline semiconductor TFTs.

14. The image display device according to claim 1, wherein said polycrystalline semiconductor TFTs are of the inverted staggered type.

15. The image display device according to claim 4, wherein crystalline grain sizes of said polycrystalline semiconductor film in said second region of said channel are smaller than those of said polycrystalline semiconductor film in said first region of said channel.

16. The image display device according to claim 4, wherein a thickness of said gate insulating film over said second region of said channel is larger than that of said gate insulating film over said first region of said channel.

17. The image display device according to claim 4, wherein a thickness of said polycrystalline semiconductor film in said second region of said channel is larger than that of said polycrystalline semiconductor film in said first region of said channel.

18. The image display device according to claim 4, wherein a work function of material of said gate electrode over said second region of said channel is higher than that of material of said gate electrode over said first region of said channel.

19. The image display device according to claim 4, wherein said polycrystalline semiconductor film in said second region contains an impurity of conductivity type opposite to that of said source and said drain.

20. The image display device according to claim 19, wherein said polycrystalline semiconductor film in said first region contains no intentionally incorporated impurity.

* * * * *